(12) United States Patent
Basson et al.

(10) Patent No.: US 11,293,993 B2
(45) Date of Patent: Apr. 5, 2022

(54) DETECTION OF AN ELECTRIC ARC HAZARD RELATED TO A WAFER

(71) Applicant: APPLIED MATERIALS ISRAEL LTD., Rehovot (IL)

(72) Inventors: Yosef Basson, Holon (IL); Samuel Ives Nackash, Nes Ziona (IL); Ittamar Levy, Rehovot (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 323 days.

(21) Appl. No.: 16/560,625

(22) Filed: Sep. 4, 2019

(65) Prior Publication Data

US 2021/0063461 A1   Mar. 4, 2021

(51) Int. Cl.
| | |
|---|---|
| *G01R 31/28* | (2006.01) |
| *H01J 37/244* | (2006.01) |
| *H01J 37/20* | (2006.01) |
| *G01R 31/50* | (2020.01) |
| *H01J 37/26* | (2006.01) |

(52) U.S. Cl.
CPC ......... *G01R 31/50* (2020.01); *G01R 31/2831* (2013.01); *H01J 37/20* (2013.01); *H01J 37/244* (2013.01); *H01J 37/26* (2013.01); *H01J 2237/24564* (2013.01)

(58) Field of Classification Search
CPC ...... G01R 31/50; G01R 31/52; G01R 31/129; G01R 31/1227; G01R 31/2831; H01J 37/244; H01J 37/20; H01J 2237/24564; H01J 37/26; H01L 22/14; H01L 22/30; H01L 21/68707
See application file for complete search history.

(56) References Cited

U.S. PATENT DOCUMENTS

| | | | | |
|---|---|---|---|---|
| 9,514,917 | B1* | 12/2016 | McIver | H05H 1/52 |
| 2004/0131303 | A1* | 7/2004 | Nippa | G02F 1/065 |
| | | | | 385/14 |
| 2011/0222191 | A1* | 9/2011 | Henke | H01H 9/542 |
| | | | | 361/2 |
| 2018/0145496 | A1* | 5/2018 | Zeller | H02H 1/0023 |
| 2019/0381516 | A1* | 12/2019 | Marra | B03C 3/368 |

\* cited by examiner

*Primary Examiner* — Christopher P McAndrew
*Assistant Examiner* — Zannatul Ferdous
(74) *Attorney, Agent, or Firm* — Kilpatrick Townsend & Stockton LLP (57) ABSTRACT

A method, a non-transitory computer readable medium and a detection system for detecting an electric arc hazard related to a wafer. The detection system may include a measurement unit, an electrode and a processing unit. The measurement unit may be configured to provide a measurement result by measuring an electrical parameter of the electrode during a test period, while the wafer may be moved in relation to the electrode, and while a certain electrical field may be formed between the electrode and the wafer; wherein the certain electrical field induces detached ends of partially detached conductive elements of the wafer to move away from the wafer. The processing unit may be configured to determine an existence of the electric arc hazard based on the measurement result.

13 Claims, 5 Drawing Sheets

DETECTION OF AN ELECTRIC ARC HAZARD RELATED TO A WAFER

BACKGROUND OF THE INVENTION

A wafer such as a semiconductor wafer undergoes multiple mechanical and chemical processes that may result in various types of defects. One type of defect is a formation of partially detachable elements. A non-limiting example of a partially detachable element is a conductive whisker.

Charged particle evaluation systems, such as a scanning electron microscope (SEM) evaluate the wafer while introducing a very high voltage difference (for example more than one thousand volts) between the wafer and an electrode of the charged particle evaluation systems. The electrode may be a part of the electron optics, and for example, may be an objective lens of the charged particle evaluation system.

An electric arc is an electrical breakdown of a gas that produces a prolonged electrical discharge. Leakage current through a normally nonconductive medium such as air produces a plasma and the plasma may produce visible light. (www.wikipedia.org).

A partially detachable element may be drawn, under high voltage conditions, towards the electrode of the charged particle evaluation system and may trigger a formation of an electric arc even when the partially detachable element does not contact the electrode.

The formation of an electric arc in a charged particle evaluation system can lead to wafer destruction, and may severely damage the charged particle evaluation system. A deterioration from (i) a state in which leakage current starts between the charged particle evaluation system and the wafer and (ii) a formation of an electric arc is very fast. In many cases the deterioration is too fast and once started, the formation of the electric arc cannot be prevented.

Accordingly, a partially detachable element is regarded as an electric arc hazard.

When high voltage conditions are not applied, the partially detachable elements are not drawn away from the wafer and are hard to detect.

There is a growing need to provide an accurate and efficient manner to detect an electric arc hazard before the formation of an actual electric arc.

BRIEF SUMMARY OF THE INVENTION

Some embodiments of the disclosure pertain to a method, a non-transitory computer readable medium and a detection system for detecting an electric arc hazard related to a wafer. The detection system may include a measurement unit, an electrode and a processing unit. The measurement unit may be configured to provide a measurement result by measuring an electrical parameter of the electrode during a test period, while the wafer may be moved in relation to the electrode, and while a certain electrical field may be formed between the electrode and the wafer; wherein the certain electrical field induces detached ends of partially detached conductive elements of the wafer to move away from the wafer. The processing unit may be configured to determine an existence of the electric arc hazard based on the measurement result.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION OF THE INVENTION

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure Any reference in the specification to a method should be applied mutatis mutandis to a system capable of executing the method and should be applied mutatis mutandis to a computer readable medium that is non-transitory and stores instructions for executing the method.

Any reference in the specification to a system should be applied mutatis mutandis to a method that may be executed by the system and should be applied mutatis mutandis to a computer readable medium that is non-transitory and stores instructions executable by the system.

Any reference in the specification to a computer readable medium that is non-transitory should be applied mutatis mutandis to a method that may be applied when executing instructions stored in the computer readable medium and should be applied mutatis mutandis to a system configured to execute the instructions stored in the computer readable medium.

The term "and/or" means additionally or alternatively.

It has been found that the detection of an electric arc hazard may be executed by a detection system that may (i) induce detached ends of partially detachable elements to be drawn away from the wafer, and (ii) to detect that the detached ends of partially detachable elements.

The detection may be performed before the wafer is evaluated by a charged particle evaluation system, and may prevent the formation of an electric arc within the charged particle evaluation system.

The detection system may be configured to detect an electric arc hazard related to a wafer. The detection system may include a supply unit or may be configured to be coupled to a supply unit. The detection system may include a wafer support unit but may be configured to receive, during a test period, a wafer that is supported by (and moved by) the wafer support unit.

Figure 1:
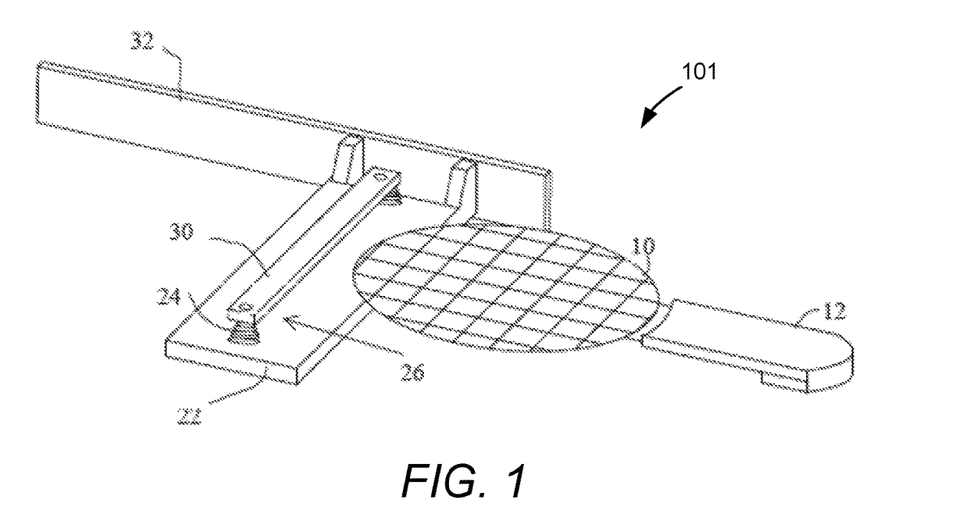
FIG. 1 illustrates an example of a portion of a detection system.

FIG. 1 illustrates an example of a portion 101 of a detection system. The detection system can include a measurement unit (denoted 201 in FIG. 3), an electrode 30 and a processing unit (denoted 210 in FIG. 3). The processing unit may include at least one processing circuit. A processing circuit may include one or more hardware processors such as one or more general purpose units, one or more graphical processing units, one or more hardware accelerators, one or more neural network chips, one or more field programmable gate array, and the like.

The measurement unit 201 is configured to provide a measurement result by measuring an electrical parameter of the electrode during a test period. During the test period, the wafer 10 is moved in relation to the electrode 30 and a certain electrical field is formed between the electrode 30 and the wafer 10. The certain electrical field may be formed by introducing a voltage difference between the electrode 30 and the wafer 10, by one or more supply units, such as supply unit 202 of FIG. 3. The certain electrical field may be of fixed value during the test period or may vary during the test period. The certain electrical field induces detached ends of partially detached conductive elements of the wafer to move away from the wafer towards electrode 30.

The certain electrical field may mimic or approximate the electrical field applied on the wafer by the charged particle evaluation system during an evaluation of the wafer by the charged particle evaluation system.

If the wafer is expected to be subjected to different values of electrical field by the charged particle evaluation system, then the certain electrical field may be determined based on one, some or all of these different values. For example, the wafer may undergo multiple different test iterations for testing different values of the certain electrical field. The outcome of the different test iterations may indicate which values of the electrical field may be safely applied by the charged particle evaluation system during the evaluation of the wafer.

The certain electrical field may be higher by at least a predefined safety gap than a highest electrical field applied on the wafer by the charged particle evaluation system. The safety gap may further reduce the risk of formation of an electric arc, and may protect against unwanted electrical field deviations within the charged particle evaluation system and/or may compensate for detection system inaccuracies in detecting the electric arc hazard.

The value of the certain electrical field may be set while taking into account any differences between the detection system and the charged particle evaluation system. For example, during the evaluation of the wafer by the charged particle evaluation system the wafer is flattened by a chuck that supports the wafer. During the evaluation of the wafer by the charged particle evaluation systems, a first distance may be maintained between the wafer and the electrode of the charged particle evaluation systems. On the other hand, the wafer may not be flattened when tested by the detection system. The detection system may receive a warped wafer and thus may position its electrode at a second distance from the wafer. The second distance may exceed the first distance on order to compensate for the wrapping of the wrapped wafer.

The introduction of a second distance that exceeds the first distance may require applying, by the detection system, a larger voltage difference to obtain the same electrical field.

Yet for another example, while the wafer is evaluated by the charged particle evaluation system, the wafer is maintained at high vacuum conditions (for example below 10-8 Bar). On the other hand, the detection system may detect the partially detachable elements in a non-vacuumed environment. Any difference in any environmental parameter may be taken into account.

The processing unit 210 may be configured to determine an existence of the electric arc hazard based on the measurement result. The processing unit 210 may generate or receive a mapping between values of the measurement result to values of electrical fields that once applied by the charged particle evaluation system will result in the formation of the electric arc.

Based on the mapping, the processing unit may determine a range of safe values of an electrical field that can be applied on the wafer (by the charged particle evaluation system) without forming an electric arc.

The processing unit 210 may determine whether the wafer may be tested by the charged particle evaluation system, and if so, under which conditions. For example, the processing unit may determine an allowable electrical field range to be applied on the wafer during a charged particle beam evaluation of the wafer.

The mapping may be determined by testing wafers, by simulating the electrical fields formed by the detection system, and by the charged particle evaluation system, and the like.

The determination of the conditions that may be applied during an evaluation of the wafer by a charged particle evaluation system may also be based on the amount of risk that the customer may tolerate.

Figure 2:
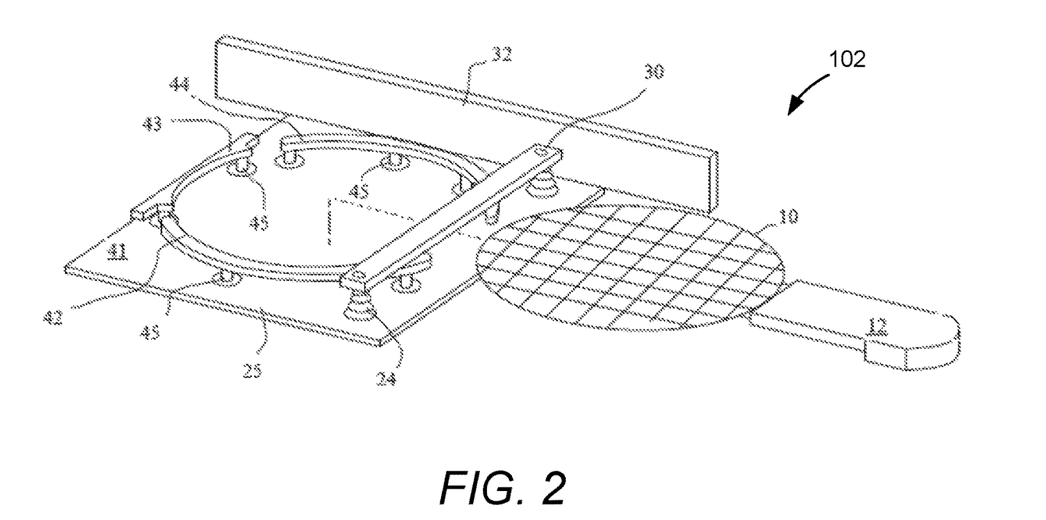
FIG. 2 illustrates an example of a portion of a detection system.
Figure 3:
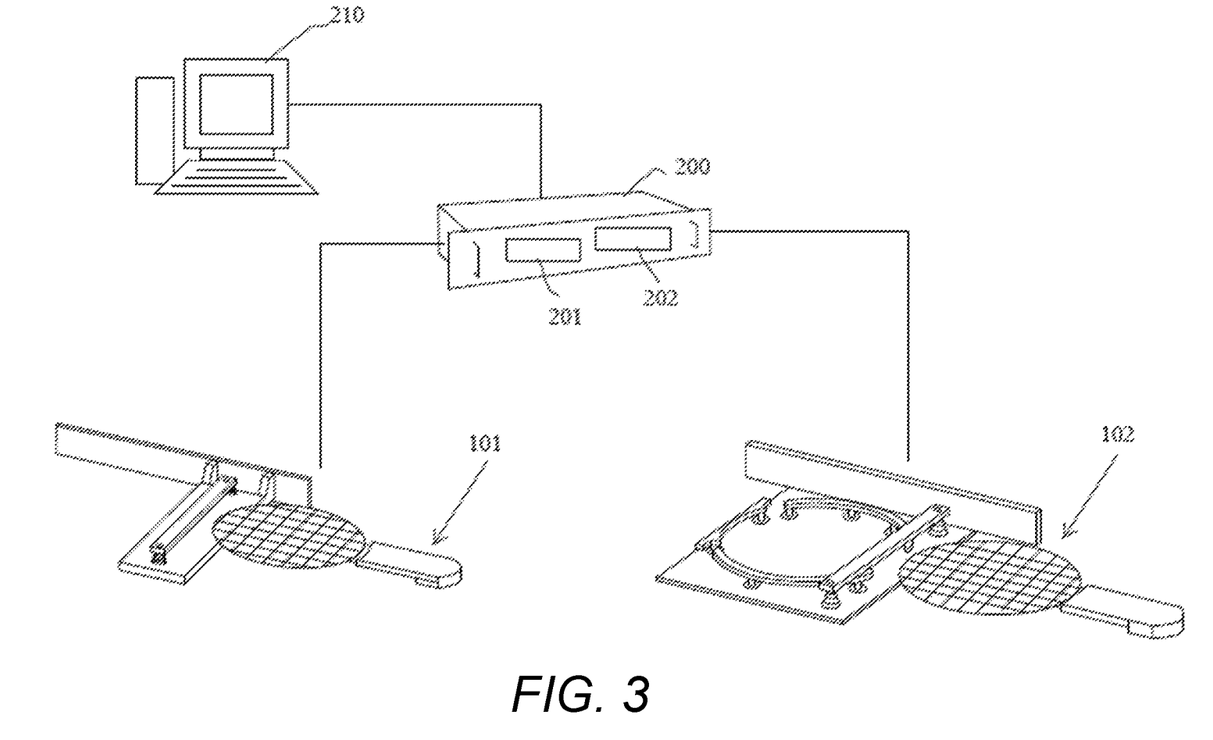
FIG. 3 illustrates an example of two versions of a detection system.

As illustrated in FIGS. 1-3, a wafer support unit 12 is used for supporting the wafer and for moving the wafer in relation to the electrode during the test period. The movement of the wafer is aimed to check whether regions of the wafer that are moved within proximity to the electrode, include partially detachable elements. The wafer may be moved without having a main body of the wafer contact the electrode.

FIG. 1 illustrates an electrode 30 that is supported by support elements 24, and a base 22. The electrode 30 and the base 22 form an opening. The entire wafer 10 may be moved within the opening 26 and outside the opening 26 in order to scan the entire top side of the wafer. Moving only a part of the wafer 10 within the opening 26 will scan only the part of the wafer for partially detachable elements. The opening may have a rectangular shape or any other shape.

The electrode 30 and the base 22 are illustrated as parallel plates—but may have other shapes. Other spatial relationships may exist between wafer 10, electrode 30 and base 22. The electrode 30 can be made of ceramics, plastic or other partially conductive materials. Alternatively, the electrode can me made of a conductive materials such as metal.

The electrode may include conductive regions and non-conductive regions. The electrode may include partially conductive regions and other regions. The electrode may be replaced by more than a single electrode that are electrically coupled to each other.

FIG. 1 also illustrates a supporting element 32 that may connect the base 22 to a frame of an evaluation device or to any other supporting structure of any other system. During the test period, the detection device may measure any leakage current between the electrode 30 and the wafer 10.

FIG. 2 illustrates an electrode 30 that is supported by support elements 24, and a base 22. The electrode 30 and the base 22 form an opening. FIG. 2 also illustrates additional electrodes 42, 43 and 44 that are supported by support elements 45. The additional electrodes are lower than electrode 30 and surround a circular space that exceeds the size of the wafer.

Once the wafer 10 is lowered to the circular space—the wafer is surrounded by the additional electrodes 42, 43 and 44, and the edge of the wafer faces the additional electrodes 42, 43 and 44—without having the main body of the wafer contact the additional electrodes 42, 43 and 44. The additional electrodes 42, 43 and 44 may detect partially detachable elements that exists on the edge of the wafer. It should be noted that a detection system may include the additional electrodes but not include electrode 30.

FIG. 3 illustrates two versions of a detection system. One version of the detection system includes portion 101 of FIG. 1. Another version of the detection system includes portion 102 of FIG. 2. In both cases the portions are electrically coupled to measurement unit 201 and supply unit 202 (collectively denoted 200) that is coupled to processing unit 210.

Figure 4:
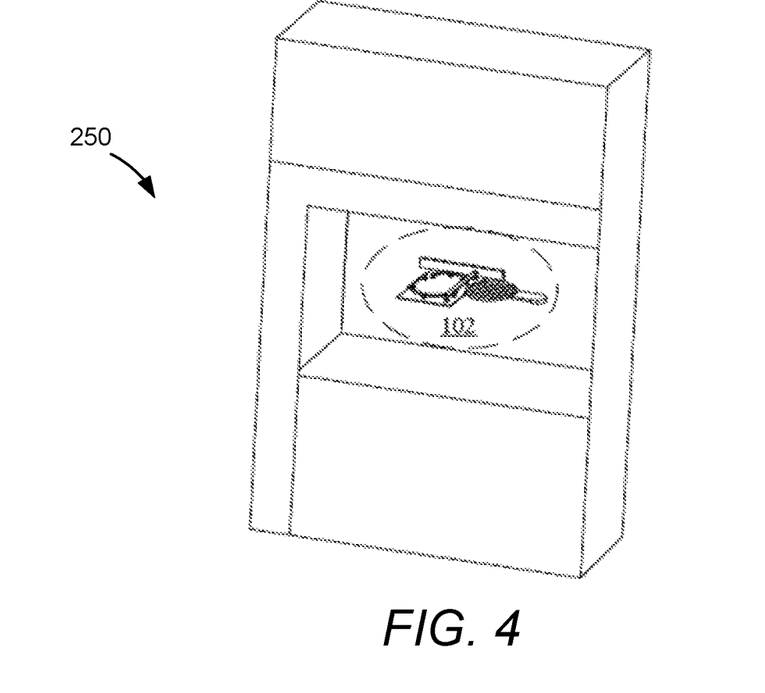
FIG. 4 illustrates a portion of a detection system embedded in a charged particle evaluation system.

FIG. 4 illustrates a portion 102 of a detection system that is embedded in a charged particle evaluation system 250. The wafer support unit may be a part of a robot used to load and unload wafers from cassettes and move the wafer from or towards a load lock. Any other locations may be provided. The detection system may be positioned outside a charged particle evaluation system.

Figure 5:
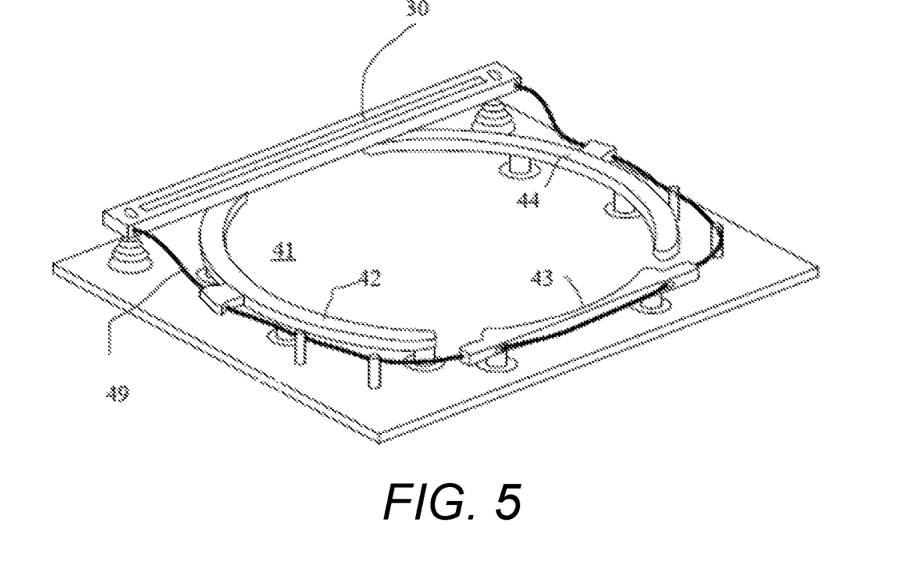
FIG. 5 illustrates an example of an electrode and additional electrodes.

FIG. 5 illustrates the electrode 30 and the additional electrodes 42, 43 and 44 as being serially coupled to each other by high voltage conductors 49 that are also coupled to the supply unit and/or the measurement unit. Electrode 30 and additional electrodes may be independently coupled to the supply unit and/or the measurement unit.

Figure 6:
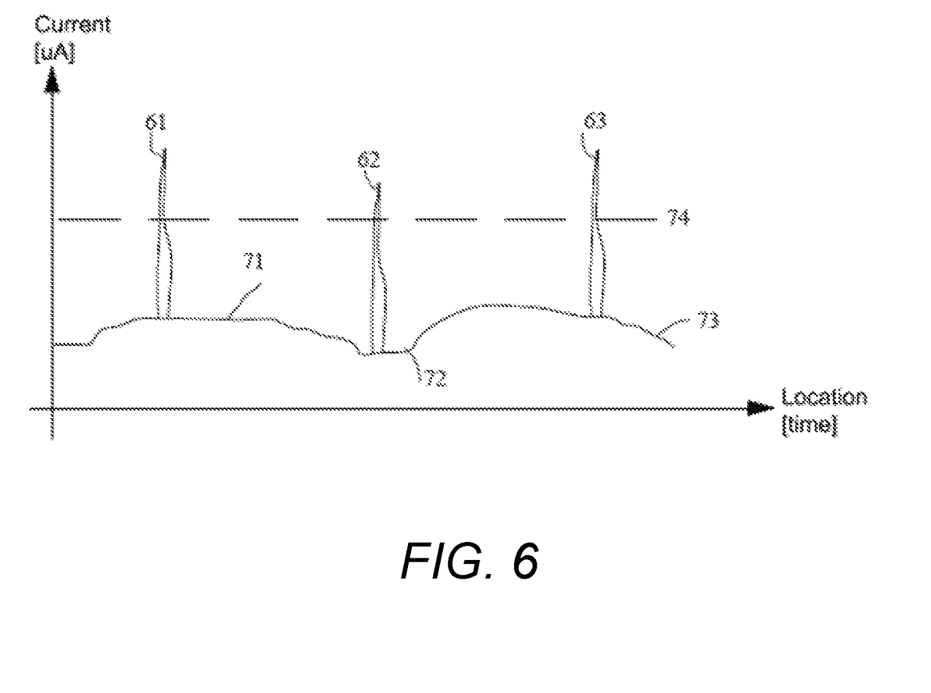
FIG. 6 illustrates examples of a leakage current measured by a measurement unit during multiple test periods.

FIG. 6 illustrates examples of a leakage current measured by a measurement unit during multiple test periods. Curve 71 illustrates negligible currents that pass through the electrode 30 while the wafer is moved inwards—into the opening formed between electrode 30 and the base.

Peak 61 represents a leakage current that may result from partially detachable elements that are partially detached to the upper side of the wafer, and may form an electric arc hazard.

Curve 72 illustrates negligible currents that pass through the electrode 30 while the wafer is lowered into the circular space surrounded by additional electrodes 42, 43 and 44.

Peak 62 represents a leakage current that may result from partially detachable elements that are partially detached to the edge of the wafer—and may form an electric arc hazard.

Curve 73 illustrates negligible currents that pass through the electrode 30 while the wafer is moved outwards—out of the detection system.

Peak 63 represents a leakage current that may result from partially detachable elements that are partially detached to the upper side of the wafer—and may form an electric arc hazard.

FIG. 6 also illustrates a current threshold 74. Peaks 61, 62 and 63 exceed the threshold and thus are indicative of an electric arc hazard. Curves 71, 72 and 73 are below the threshold and are indicative of an absence of an electric are hazard.

It should be noted that measurement results such as measured currents through the electrode may be processed by thresholding (as shown in FIG. 6), but other methods of processing the measurement results may be applied.

Figure 7:
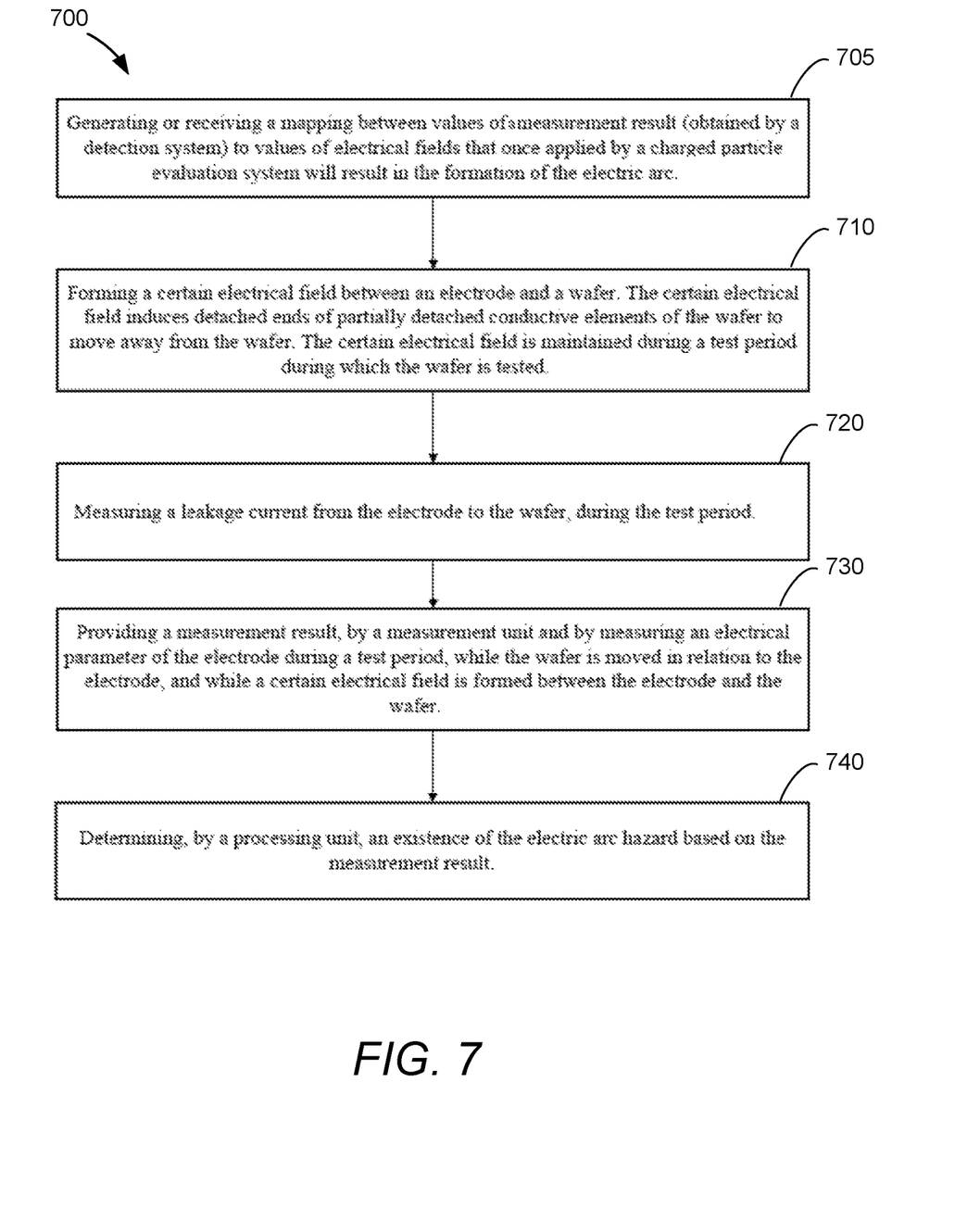
FIG. 7 illustrates an example of a method.

FIG. 7 illustrates an example of a method 700. Method 700 may be executed by detection system 100. Method 700 may include at least some steps out of steps 705, 710, 720, 730 and 740.

FIG. 7 illustrates a sequence of steps 705, 710, 720, 730 and 740. Step 705 may include generating or receiving a mapping between values of a measurement result (obtained by a detection system) to values of electrical fields that once applied by a charged particle evaluation system will result in the formation of the electric arc. Step 705 may include determining the mapping by testing wafers, or by simulating electrical fields formed by the detection system, and by the charged particle evaluation system, and the like.

Step 710 may include forming a certain electrical field between an electrode and a wafer. The certain electrical field induces detached ends of partially detached conductive elements of the wafer to move away from the wafer. The certain electrical field is maintained during a test period during which the wafer is tested. The certain electrical field may mimic or approximate the electrical field applied on the wafer by the charged particle evaluation system during an evaluation of the wafer by the charged particle evaluation system.

If the wafer is expected to be subjected to different values of electrical field by the charged particle evaluation system then the certain electrical field may be determined based one, some or all of these different values. For example, the wafer may undergo multiple different test iterations for testing different values of the certain electrical field. The outcome of the different test iterations may indicate which values of electrical field may be applied by the charged particle evaluation system during the evaluation of the wafer.

The certain electrical field may be higher by at least a predefined safety gap than a highest electrical field applied on the wafer by the charged particle evaluation system. The safety gap may further reduce the electric arc risk and may protect against unwanted electrical field deviations within the charged particle evaluation system and/or may compensate for detection system inaccuracies in detecting the electric arc hazard.

The value of the certain electrical field may be set while taking into account any differences between the detection system and the charged particle evaluation system.

For example, during the evaluation of the wafer by the charged particle evaluation system the wafer is flattened by a chuck that supports the wafer and may introduce a first distance between the wafer and the electrode of the charged particle evaluation systems. On the other hand the wafer may not be flattened when tested by the detection system. The detection system may receive a warped wafer and thus may position its electrode at a second distance from the wafer. The second distance exceeds the first distance to compensate for the wrapped wafer.

The introduction of a second distance that exceeds the first distance may require applying, by the detection system, a larger voltage difference to obtain the same electrical field.

Yet for another example, while the wafer is evaluated by the charged particle evaluation system at high vacuum conditions (for example below 10-8 Bar), the detection system may detect the partially detachable elements in a non-vacuumed environment. Any environmental parameters may be taken into account.

Step 720 may include measuring a leakage current from the electrode to the wafer, during the test period. The wafer may be electrically coupled to a wafer support unit that may grounded or be biased to another voltage level.

Step 730 may include providing a measurement result, by a measurement unit and by measuring an electrical parameter of the electrode during a test period, while the wafer is moved in relation to the electrode, and while a certain electrical field is formed between the electrode and the wafer.

There may be more than a single electrode, and step 730 may include moving the wafer in relation to the electrode and the one or more additional electrodes during one or more parts of the test period—and obtaining measurement results related to leakage current between the wafer and at least one of the electrodes.

Step 740 may include determining, by a processing unit, an existence of the electric arc hazard based on the measurement result.

Step 740 may include at least one out of:
Based on the mapping, determining a range safe values of an electrical field that can be applied on the wafer (by the charged particle evaluation system) without forming an electric arc.
Determine whether the wafer may be tested by the charged particle evaluation system—and if so—under which conditions. For example—determining an allowable electrical field range to be applied on the wafer during a charged particle beam evaluation of the wafer.
Determination electric field that may be applied during an evaluation of the wafer by a charged particle evaluation system based on an amount of risk that the customer may tolerate.

Steps 710, 720, 730 and 740 may be repeated multiple times under different values of the electrical field in order to determine the allowed region of electrical voltage applied on the wafer by a charged particle evaluation system.

Any of the mentioned above relationships may be learnt in any manner. For example—reference structural elements with recesses of known dimensions may be illuminated to provide measurements results that are associated with the known dimensions of the recesses. Additionally or alternatively—the relationship may be learnt from simulating the electron images obtained when scanning the structural elements.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

What is claimed is:

1. A detection system for detecting an electric arc hazard related to a wafer, the detection system comprising:
    a base;
    an electrode coupled to the base by one or more support elements such that a gap is formed between the electrode and the base;
    a wafer support unit configured to support and move the wafer, during a test period, through the gap formed between the electrode and the base;
    a voltage supply unit operatively coupled to introduce a voltage difference between the electrode and the wafer during the test period;
    a measurement unit configured to provide a measurement result by measuring an electrical parameter of the electrode during the test period while the wafer is moved in relation to the electrode and while the voltage supply unit introduces an electrical field between the electrode and the wafer; wherein the certain electrical field induces detached ends of partially detached conductive elements of the wafer to move away from the wafer; and
    a processing unit configured to determine an existence of the electric arc hazard based on the measurement result.

2. The detection system according to claim 1 wherein the wafer support unit is configured to support the wafer without flattening the wafer.

3. The detection system according to claim 1 wherein the measurement unit is a current meter configured to measure a leakage current from the electrode to the wafer, during the test period.

4. The detection system according to claim 3 wherein the measurement unit is configured to measure a leakage current from the electrode to the wafer, during the test period, while the electrode and a main body of the wafer are spaced apart from each other.

5. The detection system according to claim 1 wherein the electrode is supported by a support unit and is positioned above a path of the wafer during the test period.

6. The detection system according to claim 1 wherein the electrode is supported by a support unit and is configured to surround the wafer during the test period.

7. A detection system for detecting an electric arc hazard related to a wafer, the detection system comprising:
    a measurement unit;
    an electrode; and
    a processing unit;
    wherein the measurement unit is configured to provide a measurement result by measuring an electrical parameter of the electrode during a test period, while the wafer is moved in relation to the electrode, and while a certain electrical field is formed between the electrode and the wafer; wherein the certain electrical field induces detached ends of partially detached conductive elements of the wafer to move away from the wafer; and
    wherein the processing unit is configured to determine an existence of the electric arc hazard based on the measurement result;
    wherein the detection system further comprises at least one additional electrode; wherein the electrode is supported by a support unit and is positioned above a path of the wafer during a first part of the test period; and wherein the at least one additional electrode is supported by at least one additional support unit and is configured to surround the wafer during a second part of the test period.

8. The detection system according to claim 7 wherein the electrode is higher than the at least one additional electrode.

9. The detection system according to claim 1 wherein the processing unit is configured to determine an allowable electrical field range to be applied on the wafer during a charged particle beam evaluation of the wafer.

10. A method for detecting an electric arc hazard related to a wafer, the method comprising:
    providing a detection system comprising a base; an electrode coupled to the base by one or more support elements such that a gap is formed between the electrode and the base; a wafer support unit configured to support and move the wafer, during a test period, through the gap formed between the electrode and the base; and a voltage supply unit operatively coupled to introduce a voltage difference between the electrode and the wafer during the test period;
    measuring, with a measurement unit an electrical parameter of the electrode during a test period, while the wafer is moved in relation to the electrode and while the voltage supply unit introduces an electrical field between the electrode and the wafer; wherein the certain electrical field induces detached ends of partially detached conductive elements of the wafer to move away from the wafer; and
    determining, by a processing unit, an existence of the electric arc hazard based on the measurement result.

11. The method according to claim 9 further comprising measuring a leakage current from the electrode to the wafer, during the test period.

12. A non-transitory computer readable medium that stores instructions that can be executed by a processor that is part of a detection system comprising a base; an electrode coupled to the base by one or more support elements such that a gap is formed between the electrode and the base; a wafer support unit configured to support and move the wafer, during a test period, through the gap formed between the electrode and the base; and a voltage supply unit operatively coupled to introduce a voltage difference between the electrode and the wafer during the test period, where the instructions cause the detection system to:
    measure an electrical parameter of an electrode during a test period while a wafer is moved in relation to the electrode and while the voltage supply unit introduces an electrical field between the electrode and the wafer; wherein the certain electrical field induces detached ends of partially detached conductive elements of the wafer to move away from the wafer; and
    determine an existence of an electric arc hazard based on the measurement result.

13. The detection system according to claim 1 wherein the wafer is a semiconductor wafer.

\* \* \* \* \*